United States Patent
Woolard et al.

(10) Patent No.: US 10,629,513 B2
(45) Date of Patent: Apr. 21, 2020

(54) CERAMIC PLATED MATERIALS FOR ELECTRICAL ISOLATION AND THERMAL TRANSFER

(71) Applicant: EATON CORPORATION, Cleveland, OH (US)

(72) Inventors: David Glenn Woolard, Woodfin, NC (US); Paul Thomas Murray, Horse Shoe, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 14/730,333

(22) Filed: Jun. 4, 2015

(65) Prior Publication Data
US 2016/0360647 A1 Dec. 8, 2016

(51) Int. Cl.
*H01L 23/373* (2006.01)
*H05K 7/20* (2006.01)
*H01L 23/40* (2006.01)

(52) U.S. Cl.
CPC ...... *H01L 23/3731* (2013.01); *H01L 23/3735* (2013.01); *H05K 7/209* (2013.01); *H05K 7/2049* (2013.01); *H01L 23/4093* (2013.01); *H05K 7/20481* (2013.01)

(58) Field of Classification Search
CPC ............ H05K 7/20509; H05K 1/0207; H05K 7/20418; H05K 1/053; H05K 7/209; H05K 7/2049; G06F 1/20; H01L 23/4093
USPC ....... 174/252; 361/679.46–679.54, 688–723; 165/80.1–80.5, 104.33; 257/712–722
See application file for complete search history.

(56) References Cited

U.S. PATENT DOCUMENTS

| | | | | |
|---|---|---|---|---|
| 4,358,541 A * | 11/1982 | Andrus | ...................... | C03C 8/02 501/5 |
| 4,450,471 A * | 5/1984 | Wellhoefer | ......... | H01L 21/4882 228/123.1 |
| 4,703,339 A * | 10/1987 | Matsuo | .................... | H01L 23/36 165/905 |
| 4,794,048 A * | 12/1988 | Oboodi | ...................... | C03C 8/02 156/89.16 |
| 4,997,698 A * | 3/1991 | Oboodi | ............... | C03C 10/0045 257/E23.009 |
| 5,473,510 A * | 12/1995 | Dozier, II | ........... | H01L 23/4006 174/548 |
| 5,715,141 A * | 2/1998 | Karlsson | ................ | H05K 1/144 257/727 |
| 5,763,946 A * | 6/1998 | Nakadaira | ......... | H01L 23/49861 257/693 |
| 5,814,535 A * | 9/1998 | Shimada | ................ | H01L 21/486 257/E23.055 |
| 5,841,340 A * | 11/1998 | Passaro, Jr. | ............ | H05K 3/325 333/22 R |
| 6,215,185 B1 * | 4/2001 | Kikuchi | ............ | H01L 23/49579 257/718 |

(Continued)

*Primary Examiner* — Zachary Pape
(74) *Attorney, Agent, or Firm* — Eckert Seamans Cherin & Mellott, LLC

(57) ABSTRACT

The disclosed concept relates to electrical isolation between power electronic and cooling and/or mounting components and, in particular, a ceramic layer positioned at the interface of the power electronic and cooling and/or mounting components to provide electrical isolation, as well as, a thermally conductive path to remove heat produced by the power electronic component.

10 Claims, 5 Drawing Sheets

(56) References Cited

U.S. PATENT DOCUMENTS

| | | | | |
|---|---|---|---|---|
| 6,232,151 B1* | 5/2001 | Ozmat | H01L 23/051 | 257/712 |
| 6,233,817 B1* | 5/2001 | Ellis | H01L 23/142 | 257/E23.006 |
| 6,268,239 B1* | 7/2001 | Ikeda | H01L 23/3677 | 257/717 |
| 6,285,076 B1* | 9/2001 | Ando | H01L 24/72 | 257/688 |
| 6,455,930 B1* | 9/2002 | Palanisamy | H01S 5/02248 | 174/252 |
| 6,483,185 B1* | 11/2002 | Nagase | H01L 23/24 | 257/706 |
| 6,617,520 B1* | 9/2003 | Martter | H05K 3/3447 | 174/255 |
| 6,903,941 B2* | 6/2005 | Paola | H01R 12/85 | 361/790 |
| 7,412,898 B1* | 8/2008 | Smith | G01L 5/24 | 73/761 |
| 7,475,607 B2* | 1/2009 | Oboodi | G01L 1/04 | 73/862.639 |
| 7,477,519 B2* | 1/2009 | Kubo | H01L 23/04 | 165/104.33 |
| 7,558,066 B2* | 7/2009 | Eckberg | H01L 23/4006 | 165/104.33 |
| 7,746,653 B2* | 6/2010 | Negrut | H01L 23/4006 | 165/185 |
| 7,768,109 B2* | 8/2010 | Nakao | H01L 23/053 | 257/328 |
| 7,782,621 B2* | 8/2010 | Matsushiba | H01L 23/13 | 165/185 |
| 7,906,793 B2* | 3/2011 | Negley | H01L 33/486 | 257/100 |
| 8,514,579 B2* | 8/2013 | Stolze | H01L 23/3121 | 361/728 |
| 8,519,265 B2* | 8/2013 | Nakao | H01L 25/072 | 174/59 |
| 8,547,705 B2* | 10/2013 | Inaba | H01L 23/49833 | 257/734 |
| 8,772,817 B2* | 7/2014 | Yao | H01L 23/3677 | 257/676 |
| 2002/0034087 A1* | 3/2002 | Suzuki | H02M 7/003 | 363/144 |
| 2002/0119079 A1* | 8/2002 | Breuer | B01J 19/0093 | 422/128 |
| 2003/0025196 A1* | 2/2003 | Nakamura | H01L 23/3731 | 257/706 |
| 2004/0140116 A1* | 7/2004 | Bayerer | H01L 23/24 | 174/524 |
| 2004/0222433 A1* | 11/2004 | Mazzochette | H01L 25/0753 | 257/99 |
| 2005/0135065 A1* | 6/2005 | Nakatsu | H01L 23/4006 | 361/703 |
| 2006/0124953 A1* | 6/2006 | Negley | H01L 33/486 | 257/99 |
| 2007/0230184 A1* | 10/2007 | Shuy | F21K 9/00 | 362/294 |
| 2008/0151504 A1* | 6/2008 | Eckberg | H01L 23/4006 | 361/715 |
| 2008/0196869 A1* | 8/2008 | Behrens | F28F 3/12 | 165/104.33 |
| 2009/0050957 A1* | 2/2009 | Nakao | H01L 23/053 | 257/328 |
| 2009/0079061 A1* | 3/2009 | Mallik | H01L 23/13 | 257/712 |
| 2010/0284155 A1* | 11/2010 | Stolze | H01L 23/3121 | 361/728 |
| 2010/0321897 A1* | 12/2010 | Hill | B29C 66/304 | 361/720 |
| 2011/0044002 A1* | 2/2011 | Jokelainen | C23C 4/10 | 361/704 |
| 2012/0212175 A1* | 8/2012 | Sharaf | H05K 7/20272 | 320/107 |
| 2013/0063946 A1* | 3/2013 | Preuschl | F21V 23/06 | 362/249.02 |
| 2013/0069215 A1* | 3/2013 | Nakao | H01L 24/41 | 257/687 |
| 2013/0215613 A1* | 8/2013 | Wu | F21V 29/70 | 362/249.02 |
| 2013/0241046 A1* | 9/2013 | Miyashita | H01L 23/3731 | 257/705 |
| 2013/0308274 A1* | 11/2013 | Murdock | H05K 7/205 | 361/717 |
| 2014/0167235 A1* | 6/2014 | Horie | H01L 23/049 | 257/669 |
| 2014/0347819 A1* | 11/2014 | Ott | H05K 5/0082 | 361/714 |
| 2015/0260390 A1* | 9/2015 | Bretschneider | F21V 19/0055 | 362/294 |
| 2016/0057881 A1* | 2/2016 | Tada | H05K 7/1432 | 361/728 |
| 2016/0218048 A1* | 7/2016 | Kazemi | H01L 23/3672 | |

* cited by examiner

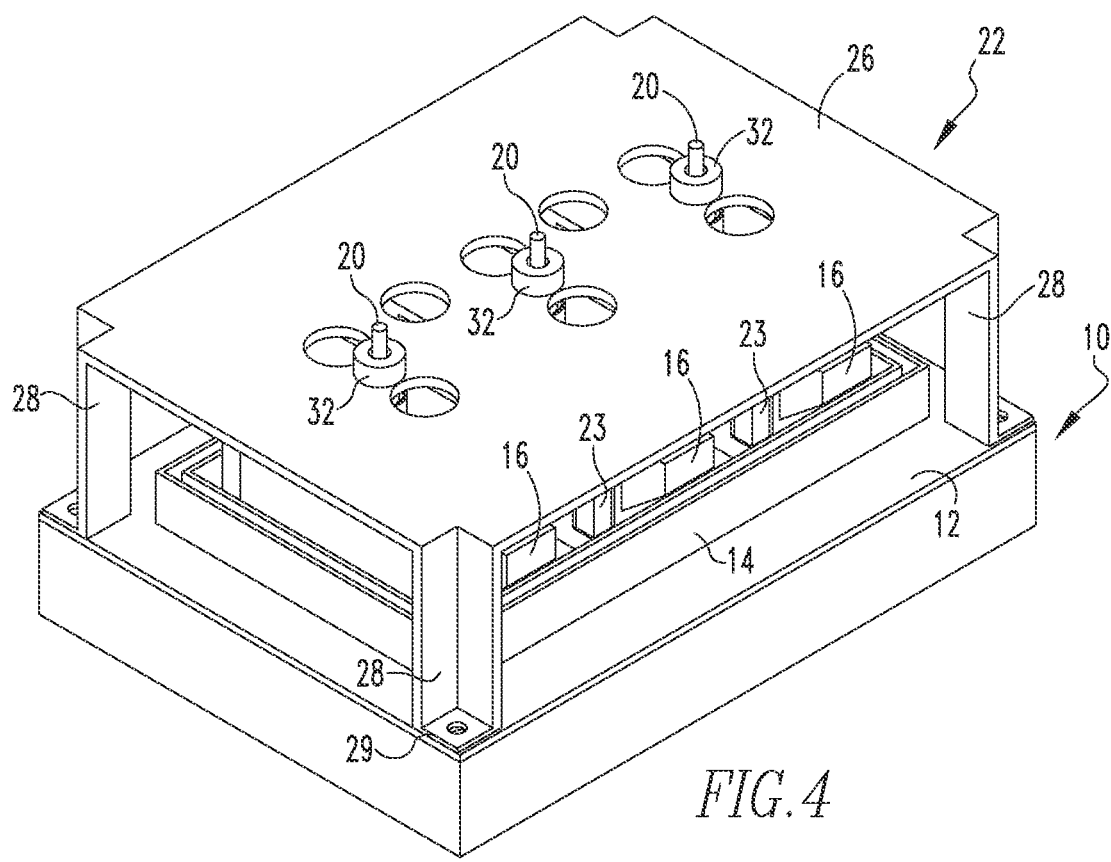
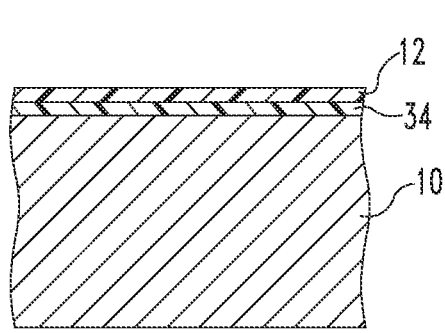
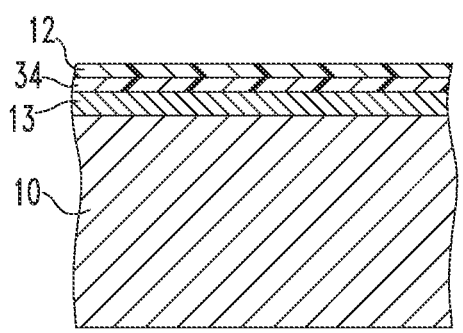

CERAMIC PLATED MATERIALS FOR ELECTRICAL ISOLATION AND THERMAL TRANSFER

BACKGROUND

Field

The disclosed concept relates generally to power electronic devices, cooling and/or mounting devices therefor and, ceramic coatings applied to the cooling and/or mounting devices.

Background Information

It is known in the art to provide cooling and/or mounting devices with power electronic devices for the purpose of removing at least a portion of the heat generated by the power electronic devices, such as diodes. It is also known that in certain instances the power electronic devices may operate at voltages that exceed their isolation rating. Therefore, the cooling and/or mounting devices are also at an elevated potential voltage. It is necessary to isolate the power electronic devices from ground to prevent arcing or ground currents, which can cause noise on a system, degrade or damage a system, and potentially lead to operator injury or death. If the cooling and/or mounting devices use electrically conductive cooling medium, such as water, the entire water circuit can serve as a path to ground thereby resulting in the cooling circuit itself being unsafe.

Isolation pads and films are known for use in isolating the power electronic devices. However, there are disadvantages associated with many of these pads and films. For example, it has been found that the pads or films can have poor thermal conductivity and/or poor adhesion. In some instances, a thermal grease or epoxy may be required to adhere the pad or film to the surface of the device. The use of an intermediate layer for purposes of enhancing adherence may result in increased contact losses and reduced effective conductivity.

There is room for improvement in power electronic devices and the cooling and/or mounting devices associated therewith. It would be advantageous for the cooling and/or mounting devices to include a ceramic coating or layer applied to a surface thereof, such that the surface is effective to isolate the cooling and/or mounting devices while providing a means of thermal transfer.

SUMMARY

These needs and others are met by embodiments of the disclosed concept, which are directed to power electronic devices and cooling and/or mounting devices associated therewith, and furthermore to coating compositions for use in applying a protective coating to the surface of the cooling and/or mounting devices to provide effective isolation and thermal transfer.

As one aspect of the disclosed concept, a power electronic device and cooling device interface is provided. The interface includes a cooling device having a top surface, a ceramic layer applied to the top surface of the cooling device and a power electronic device in contact with the ceramic layer.

The power electronic device can be selected from a single diode or insulated-gate bipolar transistor, or a plurality of diodes or insulated-gate bipolar transistors.

The cooling device may be selected from a cold plate, heat spreader or heat sink.

In certain embodiments, the ceramic layer includes a ceramic coating composition. The ceramic coating composition may be selected from pure ceramic, ceramic-based compositions and ceramic-containing compositions. The ceramic layer can include ceramic selected from boron nitride, alumina, aluminum nitride, silica and mixtures thereof. In certain embodiments, the ceramic coating composition is applied directly to the top surface of the cooling device. In other embodiments, the ceramic coating composition is applied directly to a substrate and the substrate is connected to the top surface of the cooling device. The substrate may be a metal sheet or metal plate.

In certain embodiments, the ceramic coating composition can be applied to an intermediate coating layer.

The interface can further include a clamp device to house the power electronic device and, a swivel to contact the clamp device. The swivel is structured to rotate in one direction to apply pressure to the clamp device and to rotate in an opposite direction to release pressure from the clamp device.

In another aspect of the disclosed concept, a power electronic device and cooling device apparatus is provided. The apparatus includes a cooling device having a top surface and a bottom surface; a power electronic device including a base plate, the base plate having an upper surface and a lower surface, the lower surface of the base plate forming an interface with the top surface of the cooling device; a fastening mechanism having a horizontal portion, a vertical portion and a tip; an aperture having a radial surface and being adapted to receive the vertical portion of the fastening mechanism therein; a ceramic layer applied to the top surface of the cooling device and the radial surface of the aperture; a nut structured to engage the tip of the fastening mechanism. Wherein the aperture is formed to extend vertically through the cooling device, the ceramic layer and the power electronic device.

When the fastening mechanism is composed of metal, the ceramic layer can be further applied to a surface of the fastening mechanism.

Further, when the nut is composed of metal, the ceramic layer can be further applied to at least one of the bottom surface of the cooling device and a surface of the nut.

BRIEF DESCRIPTION OF THE DRAWINGS

A full understanding of the disclosed concept can be gained from the following description of the preferred embodiments when read in conjunction with the accompanying drawings in which:

FIG. 4 is a schematic showing the ceramic coated cooling device and diode combination shown in FIG. 3 with the addition of a framework, in accordance with certain embodiments of the disclosed concept;

FIG. 5A is a schematic showing the cooling device of FIG. 1C with an intermediate layer directly applied thereto and the ceramic coating directly applied to the intermediate layer, in accordance with certain embodiments of the disclosed concept;

FIG. 5B is a schematic showing the cooling device of FIG. 1D with an intermediate layer directly applied to the plate and the ceramic coating directly applied to the intermediate layer, in accordance with certain embodiments of the disclosed concept;

DESCRIPTION OF THE PREFERRED EMBODIMENTS

Figure 1A:
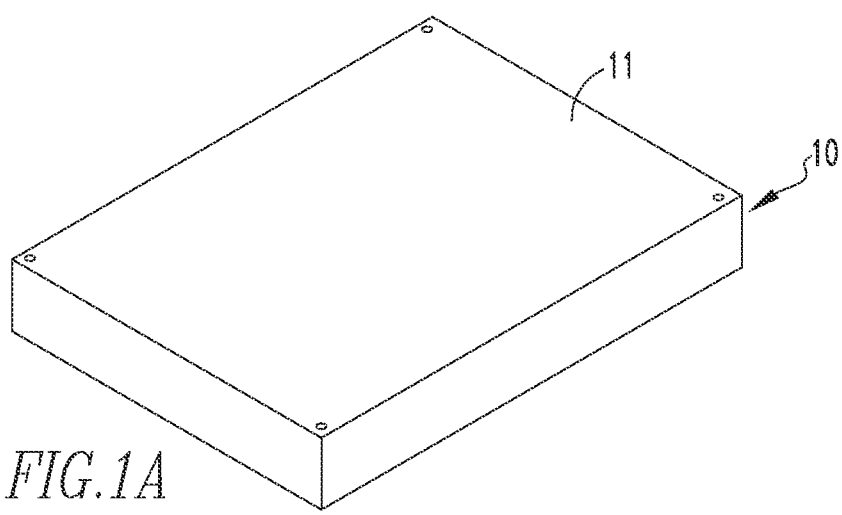
FIG. 1A is a schematic showing an isometric view of a cooling device, in accordance with the prior art.

Directional phrases used herein, such as, for example, left, right, clockwise, counterclockwise, top, bottom and derivatives thereof, relate to the orientation of the elements shown in the drawings and are not limiting upon the claims unless expressly recited therein.

As employed herein, the statement that two or more parts are "coupled" or "connected" together shall mean that the parts are joined together either directly or joined through one or more intermediate parts.

As employed herein, the term "number" shall mean one or an integer greater than one (i.e., a plurality).

FIG. 1A is a schematic showing a cold plate 10 having a top surface 11, which is employed as a cooling device associated with power electronic devices in accordance with the prior art. Various cooling devices are known in the art, such as, but not limited to liquid cold plates. The liquid associated with a cold plate is referred to as a primary cooling source, which can include, but is not limited to, water, refrigerant or phase change medium. The disclosed concept can be equally applied to a wide variety of cooling devices.

Figure 1B:
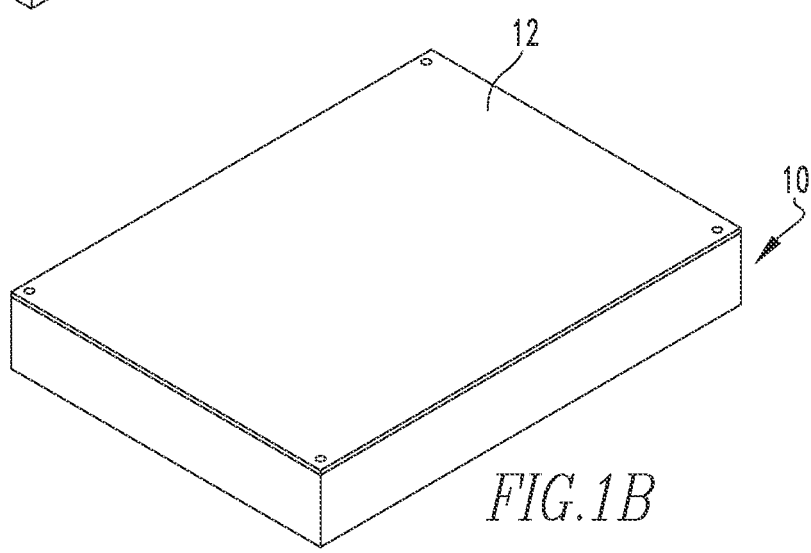
FIG. 1B is a schematic showing an isometric view of the cooling device of FIG. 1A with a ceramic coating applied thereto, in accordance with certain embodiments of the disclosed concept.

FIG. 1B is a schematic showing the cold plate 10 as shown in FIG. 1A. In addition, FIG. 1B includes a ceramic layer 12 formed on the top surface 11 (shown in FIG. 1A) of the cold plate 10. The ceramic layer 12 can be formed by depositing or applying a ceramic coating composition directly to the top surface 11 of the cold plate 10. As shown in FIG. 1B, the ceramic layer 12 extends over the entire top surface 11 of the cold plate 10. However, it is understood that the ceramic layer 12 may be deposited or applied such that it covers only a portion of the top surface 11 of the cold plate 10.

Figure 1C:
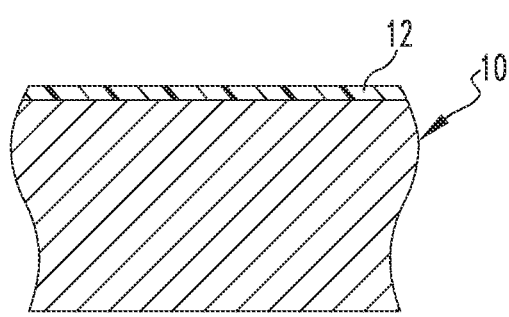
FIG. 1C is a schematic showing a cross-section view of the cooling device of FIG. 1B, in accordance with certain embodiments of the disclosed concept.

FIG. 1C is a schematic showing a cross-section of the cold plate 10 and the ceramic layer 12 shown in FIG. 1B. As shown in FIG. 1C, the ceramic layer 12 is deposited or applied directly onto the top surface 11 (shown in FIG. 1A) of the cold plate 10.

Figure 1D:
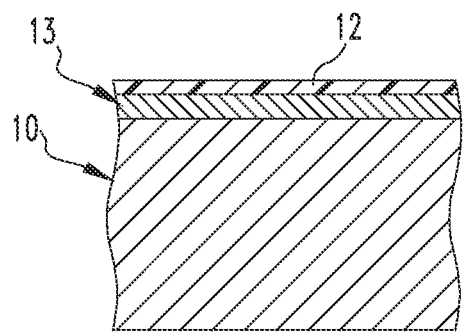
FIG. 1D is a schematic showing a cross-section view of the cooling device of FIG. 1A with a ceramic coated plate applied thereto, in accordance with certain embodiments of the disclosed concept.

In an alternate embodiment, the ceramic layer 12 can be formed by depositing or applying a ceramic coating composition to a substrate, such as, a metal sheet or metal plate, and connecting the ceramic coated substrate to the cold plate 10. FIG. 1D is a schematic showing a cross-section of the cold plate 10 and the ceramic layer 12 shown in FIG. 1B. In addition, FIG. 1D includes a substrate 13, which can be constructed of metal. As shown in FIG. 1D, the ceramic layer 12 is directly deposited or applied to a top surface of the substrate 13, and a bottom surface of the substrate 13 is connected or coupled to the top surface 11 of the cold plate 10. Various mechanisms for connecting or coupling one substrate to another are known in the art. In certain embodiments, the substrate 13 is connected to the cold plate 10 by welding. In FIG. 1D, the substrate 13 covers the entire top surface of the cold plate 10. However, it is contemplated and understood that the substrate 13 may cover only a portion of the top surface of the cold plate 10. In addition, there may be a recess formed in the top surface of the cold plate 10, such that the substrate 13 is placed within the recess and therefore, the substrate 13 is flush with the top surface of the cold plate 10.

Deposition or application of the ceramic coating composition, e.g., to the cold plate 10 or the substrate 13, to form a ceramic layer 12 can be accomplished using various conventional apparatus and techniques known in the art, such as, spraying, brushing, wiping and the like. The disclosed concept includes the use of pure ceramic compositions, ceramic-based compositions and ceramic-containing compositions. Suitable ceramics for use can be selected from a wide variety of ceramics known in the art, such as, but not limited to, boron nitride, alumina, aluminum nitride, silica and mixtures thereof. In certain embodiments, the ceramic composition is Thermolon®, which is commercially available from Porcelain Industries.

Figure 2:
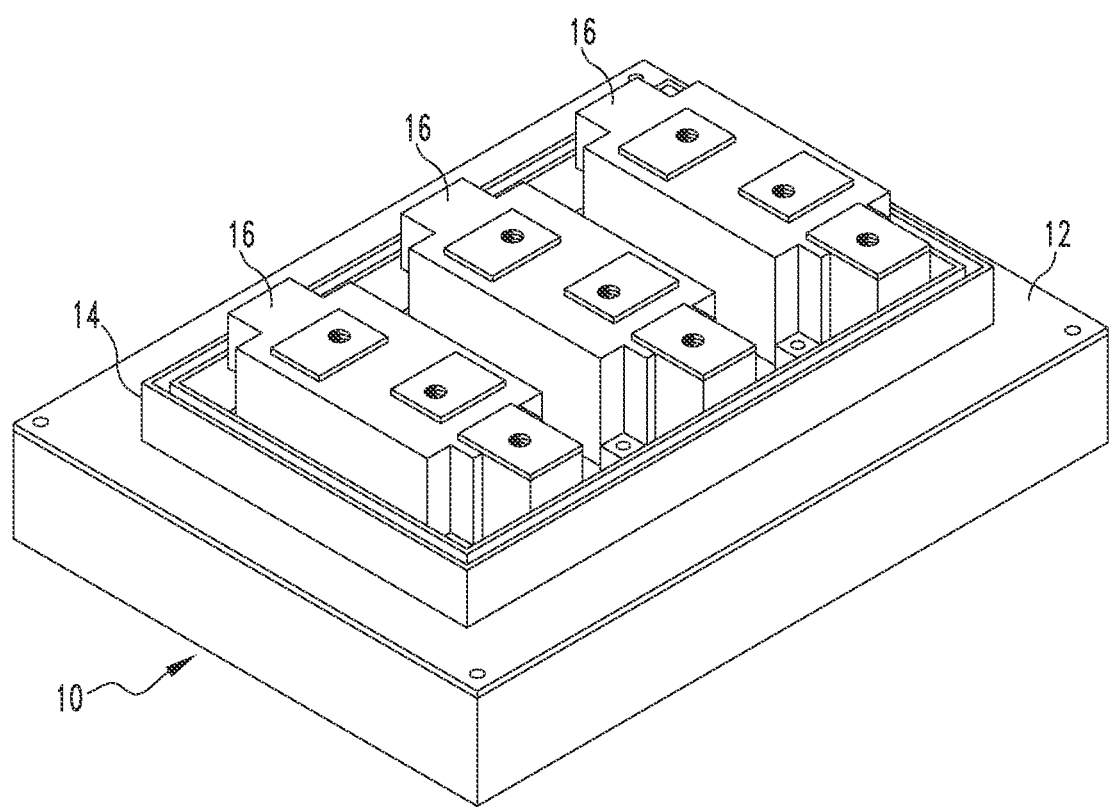
FIG. 2 is a schematic showing the ceramic coated cooling device of FIG. 1B in combination with a plurality of diodes, in accordance with certain embodiments of the disclosed concept.

FIG. 2 is a schematic showing the cold plate 10 and the ceramic layer 12, as shown in FIG. 1B. In addition, FIG. 2 includes a creep barrier 14 and a plurality of diodes 16 positioned on the top surface 11 (shown in FIG. 1A) to interface with the cold plate 10 and to contact the ceramic layer 12. The diodes 16 are located within the area that is formed and encompassed by the creep barrier 14. There are three diodes shown in FIG. 2, however, it is contemplated that there can be more or less than three diodes in certain other embodiments of the disclosed concept. For example, there can be a single diode or a plurality of diodes. Furthermore, it is understood that the diodes 16 are representative of a power electronic device for use in accordance with certain embodiments of the disclosed concept; however, it is contemplated that a variety of other power electronic devices are known in the art and can be employed in the disclosed concept. For example, one or more insulated-gate bipolar transistors may be used.

Although, as shown in FIG. 2, the ceramic layer 12 extends over the entire top surface 11 of the cold plate 10, it is understood that the ceramic layer 12 may be deposited or applied to the cold plate 10 such that it covers only the portion of the top surface 11 that is encompassed by the creep barrier 14 (and the portion of the surface of the cold plate 10 that extends beyond the creep barrier 14 is not covered by the ceramic layer 12). Further, it is understood that in certain embodiments, the creep barrier 14 may be absent. Furthermore, although FIG. 2 shows a plurality of diodes 16, it is contemplated that there are a wide variety of power electronic devices known in the art, which are associated with cooling devices, and the disclosed concept can be equally applied to the wide variety of power electronic devices.

Figure 3:
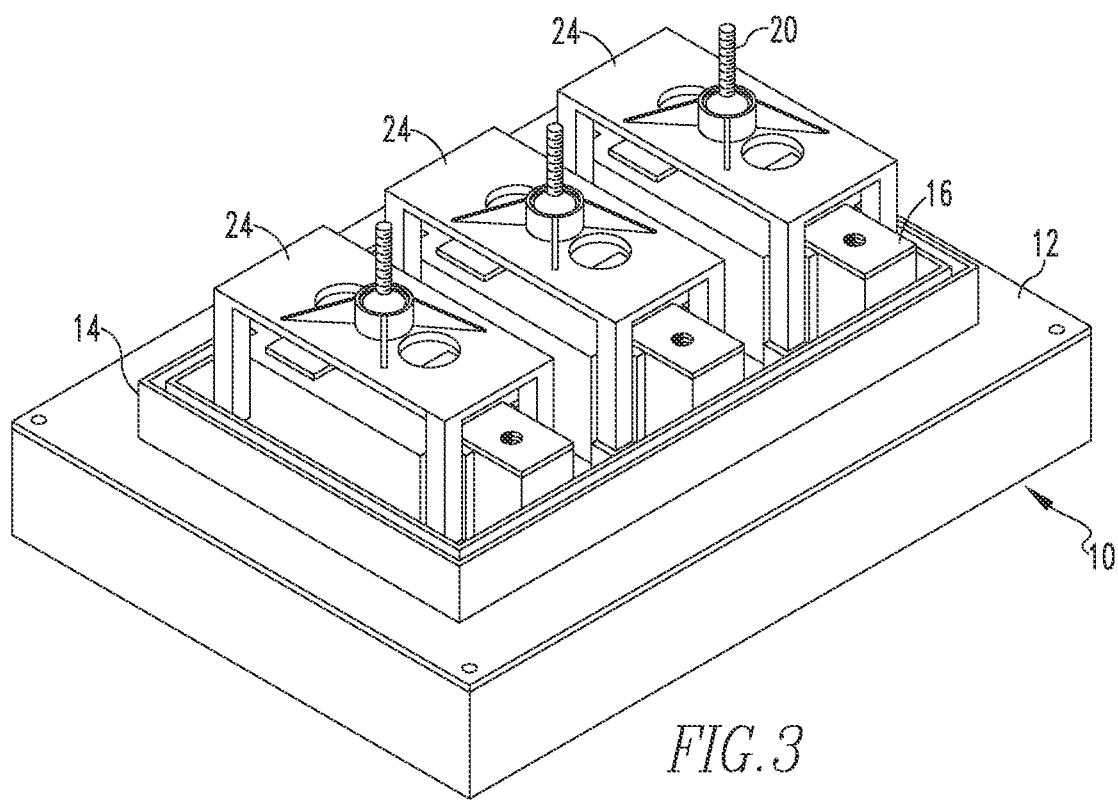
FIG. 3 is a schematic showing the ceramic coated cooling device and diode combination shown in FIG. 2, with the addition of clamp and swivel devices, in accordance with certain embodiments of the disclosed concept.
Figure 3A:
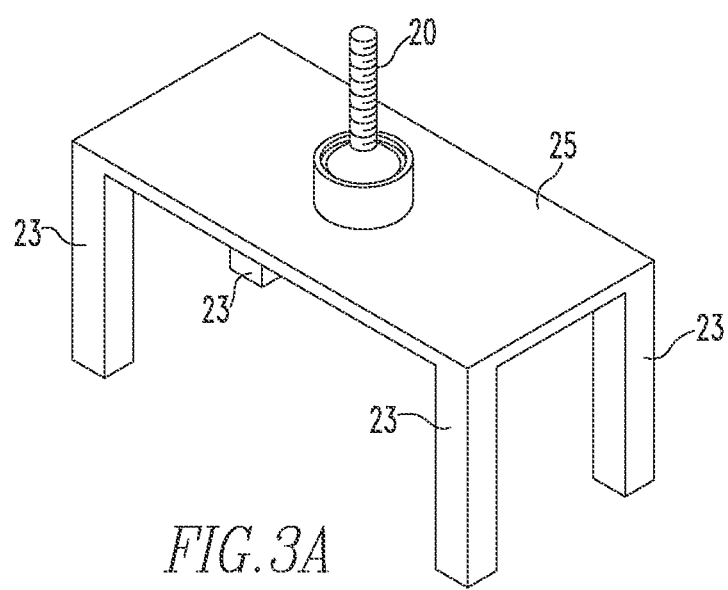
FIG. 3A is a schematic showing a detailed view of one of the clamp and swivel devices of FIG. 3, in accordance with certain embodiments of the disclosed concept.

FIG. 3 is a schematic showing the cold plate 10, ceramic layer 12, creep barrier 14 and plurality of diodes 16 shown in FIG. 2. In addition, FIG. 3 shows a plurality of threaded swivels 20 and a corresponding plurality of clamps 24. Each one of the combined plurality of threaded swivels 20 and clamps 24 is positioned to house a corresponding one of the plurality of diodes 16. FIG. 3A is a schematic showing a detailed view of one of the plurality of clamps 24. As shown in FIG. 3A, each one of the clamps 24 includes an upper surface 25 and a plurality of legs 23, each of which extends downwardly from a corresponding corner of the upper surface 25. One end of each of the plurality of legs 23 is attached or coupled to the upper surface 25 and the other end of each of the plurality of legs 23 is in contact with the surface of the baseplate of the diode.

FIG. 4 is a schematic showing the cold plate 10, ceramic layer 12, creep barrier 14, plurality of diodes 16, plurality of legs 23 and plurality of threaded swivels 20 shown in FIG. 3. In addition, FIG. 4 includes a framework 22. The framework 22 has a top canopy 26 and a plurality of extensions 28, each extending downwardly from the top canopy 26. One end of each of the extensions 28 is attached or coupled to a corner of the canopy 26. In certain embodiments, the canopy 26 and the plurality of extensions 28 are a single integrated or molded piece. An opposite end of each of the plurality of extensions 28 is structured to correspond and connect or fasten to a corner portion of the top surface 11 of the cold plate 10. Various means of connecting or fastening one surface to another are well known in the art. In certain embodiments, each of the plurality of extensions 28 can include an aperture 29, which aligns with an aperture formed in the top surface 11 (shown in FIG. 1A) of the cold plate 10. A fastening mechanism (not shown), such as, a bolt, can be inserted within each of the apertures to secure the framework 22 to the cold plate 10. The canopy 26 also includes a plurality of swivel apertures (not shown) formed therein and a plurality of nuts 32, which are structured to receive each of the plurality of threaded swivels 20. As shown in FIG. 4, each of the plurality of threaded swivels 20 is inserted into each of the corresponding plurality of nuts 32 to secure an interface between the plurality of diodes 16 and the cold plate 10. For example, as each of the plurality of threaded swivels 20 is rotated into one of the plurality of nuts 32 and tightened, a tip of each of the plurality of the threaded swivels 20 contacts and presses downward on the each of the corresponding plurality of clamps 24, which causes pressure to be applied to the plurality of diodes 16 in contact with the cooling plate 10. Each of the plurality of threaded swivels 20 is rotated in one direction to apply pressure to each of the corresponding plurality of clamps 24 and is rotated in an opposite direction to release the pressure.

In accordance with certain embodiments of the disclosed concept, the ceramic coating composition is deposited or applied directly onto the top surface 11 of the cold plate 10 to form the ceramic layer 12 (shown FIG. 1C). In certain other embodiments, the ceramic coating composition is deposited or applied directly onto a substrate 13, which is connected to the top surface 11 of the cold plate 10 (shown in FIG. 1D). Alternately, in these embodiments, the surface to be coated (e.g., the top surface 11 or the substrate 13) can be pre-treated prior to depositing or applying the ceramic coating composition. For example, there may be deposited or applied an intermediate layer such that the ceramic coating composition is deposited or applied to the intermediate layer instead of being directly to the top surface 11 of the cold plate 10 or the substrate 13. The intermediate layer may serve various functions, such as, but not limited to, providing enhanced adhesive properties to adhere the ceramic coating composition to the top surface 11 of the cold plate 10 or the substrate 13. Various materials are known in the art for providing adhesive properties to enhance adherence between two surfaces, which can be used in the disclosed concept.

FIG. 5A shows a cross-section view of the cold plate 10 and ceramic layer 12 shown in FIG. 1C. In addition, FIG. 5A includes an intermediate layer 34 deposited or applied to the top surface 11 (shown in FIG. 1A) of the cold plate 10 and the ceramic layer 12 is then formed on top of the intermediate layer 34, such as, by depositing or applying the ceramic coating composition onto an outer surface of the intermediate layer 34. Alternately, FIG. 5B shows a cross-section view of the cold plate 10, ceramic layer 12 and substrate 13 shown in FIG. 1D. In addition, FIG. 5B includes the intermediate layer 34 deposited or applied to the substrate 13 and the ceramic layer 12 is then formed on top of the intermediate layer 34, such as, by depositing or applying the ceramic coating composition onto an outer surface of the intermediate layer 34.

In certain embodiments of the disclosed concept, a fastening mechanism, such as, one or more bolts or the like can be employed to mount a cooling device, e.g., a cold plate, with a power electronic device, e.g., a diode. The use of the one or more bolts as the fastening mechanism requires that one or more corresponding mounting holes or apertures are formed within the cold plate and the diode. As such, the one or more bolts contact the diode baseplate and as a result, bypass a ceramic coating that may be applied to the surface of the cold plate and provide a path to ground. In accordance with the disclosed concept, the surface of the mounting apertures, e.g., an internal radial surface, can be coated with a ceramic composition to form a ceramic coating on the surface of the mounting apertures.

In certain embodiments, the one or more bolts are composed or constructed of metal. In these embodiments, the one or more metal bolts can be coated with the ceramic composition. In other embodiments, the one or bolts may be composed of a non-metal material, such as, but not limited to, plastic or fiberglass.

Figure 6:
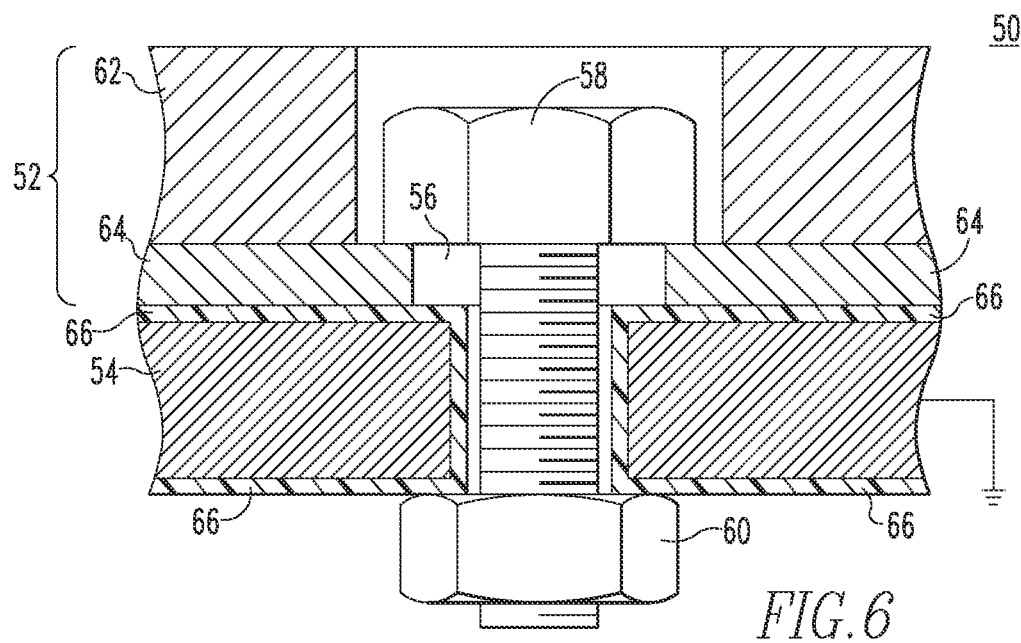
FIG. 6 is a schematic showing a metal mounting device for a cooling device and diode combination, in accordance with certain embodiments of the disclosed concept.

FIG. 6 shows a power electronic device and associated cooling device combination 50 in accordance with certain embodiments of the disclosed concept. The combination 50 includes a diode 52, a cold device 54, a mounting aperture 56, a metal bolt 58 and a metal nut 60. The diode 52 consists of a case 62 and a metal baseplate 64. The metal baseplate 64 can be composed of a wide variety of metals and metal alloys. In certain embodiments, the metal baseplate 64 is composed of alumina silica carbide. The mounting aperture 56 extends through the metal baseplate 64 and the cold device 54. The metal bolt 58 has a horizontal portion, a vertical portion and a tip. The horizontal portion of the metal bolt 58 is in contact with the metal baseplate 64. The vertical portion of the metal bolt 58 extends through the mounting aperture 56. The tip of the metal bolt 58 has fitted thereon the metal nut 60 to secure the metal bolt 58 within the mounting aperture 56 and, the interface between the diode 52 and the cold device 54. A ceramic coating composition is deposited or applied to a top surface of the cold device 54 such that the ceramic coating layer 66 is formed at the interface. In addition, the ceramic coating layer 66 is formed on each of two side surfaces of the cold device 54, which form the mounting aperture 56 and its radial surface. Thus, the radial surface of the aperture 56 has applied thereto the ceramic coating layer 66. Furthermore, the ceramic coating layer 66 is applied to a bottom surface of the cold device 54, such that the metal nut 60 contacts the ceramic coating layer 66.

As shown in FIG. 6, since the metal bolt 58 and metal nut 60 are used, all surfaces that contact these metal components are ceramic coated with the ceramic coating layer 66. However, if the bolt and the nut are not composed of metal, it is not necessary to ceramic coat the bottom surface of the cold device 54 that contacts the nut.

Figure 7:
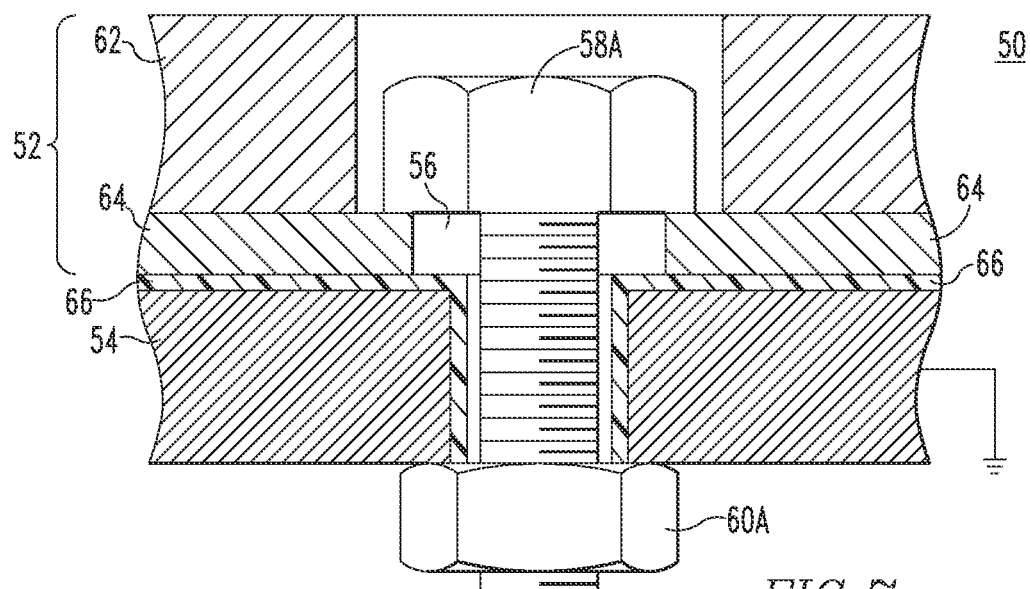
FIG. 7 is a schematic showing a non-metal mounting device for a cooling device and diode combination, in accordance with certain embodiments of the disclosed concept.

FIG. 7 shows the combination 50 shown in FIG. 6 including the diode 52, cold device 54, mounting aperture 56, case 62, metal baseplate 64 and ceramic coating layer 66. However, in FIG. 7, a non-metal bolt 58A and a non-metal nut 60A are used. Thus, as shown in FIG. 7, the ceramic coating layer 66 is only applied to the interface of the metal baseplate 64 of the diode 52 and the cold device 54, and to the interface of the cold device 54 and the mounting aperture 56.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A power electronic device and cooling device apparatus, comprising:
   a cooling device having a surface;
   a ceramic composition applied to the surface to form a ceramic coating on the cooling device;
   a power electronic device in contact with the ceramic coating; and
   a clamp assembly adapted to apply pressure to the power electronic device towards the cooling device, wherein the ceramic coating is selected from the group consisting of: a ceramic coating directly on the surface of the cooling device, and a ceramic coating on an intermediary that is positioned on the surface of the cooling device, the intermediary selected from the group consisting of a substrate, an intermediate coating, and a combination of a substrate and an intermediate coating, the substrate is selected from the group consisting of a metal sheet or a metal plate.

2. The apparatus of claim 1, wherein the power electronic device is selected from a single diode, a plurality of diodes, a single insulated-gate bipolar transistor and a plurality of insulated-gate bipolar transistors.

3. The apparatus of claim 1, wherein the cooling device is selected from the group consisting of cold plate, heat spreader and heat sink.

4. The apparatus of claim 1, wherein the ceramic coating comprises a material selected from the group consisting of a pure ceramic, a ceramic-based composition and a ceramic-containing composition.

5. The apparatus of claim 1, wherein the clamp assembly comprises:
   a clamp device to house the power electronic device;
   a swivel to contact the clamp device,
   wherein the swivel is structured to rotate in one direction to apply pressure to the clamp device and to rotate in an opposite direction to release pressure from the clamp device.

6. The apparatus of claim 1, wherein the ceramic coating comprises ceramic selected from the group consisting of boron nitride, alumina, aluminum nitride, silica and mixtures thereof.

7. A power electronic device and cooling device apparatus, comprising:
   a cooling device having a top surface and a bottom surface;
   a power electronic device comprising a base plate, the base plate having an upper surface and a lower surface, the lower surface of the base plate forming an interface with the top surface of the cooling device;
   a fastening mechanism having a horizontal portion, a vertical portion and a tip;
   an aperture having a radial surface and being adapted to receive the vertical portion of the fastening mechanism therein;
   a ceramic layer applied to the top surface of the cooling device and the radial surface of the aperture, the ceramic layer selected from the group consisting of:
      a ceramic coating directly deposited on the top surface of the cooling device and the radial surface of the aperture, and
      a ceramic coating deposited on an intermediary that is positioned on the top surface of the cooling device and the radial surface of the aperture, the intermediary selected from the group consisting of a substrate, an intermediate coating layer, and a combination of a substrate and an intermediate coating layer; and
   a nut structured to engage the tip of the fastening mechanism,
   wherein, the aperture is formed to extend vertically through the cooling device, the ceramic layer and the power electronic device.

8. The apparatus of claim 7, wherein when the fastening mechanism is composed of metal, the ceramic layer is further applied to a surface of the fastening mechanism.

9. The apparatus of claim 7, wherein when the nut is composed of metal, the ceramic layer is further applied to at least one of the bottom surface of the cooling device and a surface of the nut.

10. A power electronic device and cooling device apparatus, comprising:
    a cooling device having a top surface;
    a power electronic device comprising a base plate, the base plate having a lower surface;
    a ceramic interface positioned between the top surface of the cooling device and the lower surface of the base plate;
    a fastening mechanism having an exterior surface, structured to couple the cooling device and the power electronic device;
    an aperture having a radial surface, formed to extend vertically through the cooling device, the ceramic layer and the power electronic device, and adapted to receive the fastening mechanism; and
    a ceramic layer applied to one or more of the exterior surface of the fastening mechanism and the radial surface of the aperture to form a ceramic interface between the fastening mechanism and the radial surface of the aperture.

* * * * *